United States Patent
Bormann et al.

[11] 4,023,149
[45] May 10, 1977

[54] STATIC STORAGE TECHNIQUE FOR FOUR TRANSISTOR IGFET MEMORY CELL

[75] Inventors: Alan R. Bormann; William L. Martino; Jerry D. Moench, all of Tempe, Ariz.

[73] Assignee: Motorola, Inc., Chicago, Ill.

[22] Filed: Oct. 28, 1975

[21] Appl. No.: 626,596

[52] U.S. Cl. .................. 340/173 R; 340/173 FF; 340/173 CA; 307/238; 307/279
[51] Int. Cl.² ........................................ G11C 11/40
[58] Field of Search ... 340/173 R, 173 FF, 173 CA; 307/238, 279

[56] References Cited
UNITED STATES PATENTS

| | | | |
|---|---|---|---|
| 3,518,635 | 6/1970 | Cole et al. | 340/173 FF |
| 3,949,383 | 4/1976 | Askin et al. | 340/173 FF |

*Primary Examiner*—Terrell W. Fears
*Attorney, Agent, or Firm*—Charles R. Hoffman

[57] ABSTRACT

A four-IGFET memory cell is utilized as a static (or DC) memory cell rather than as a dynamic memory cell. When the memory cell is in the standby mode an intermediate voltage is applied to a selection conductor coupled to the gates of the gating IGFETS of the memory cell. The intermediate voltage applied to the "X" selection conductor under standby conditions is slightly in excess of two IGFET threshold voltages, and is sufficient to maintain the stored logical state, yet causes very little power to be dissipated by the memory cell. A full logical "1" level is applied to the selection conductor during either a read operation or a write operation if the memory cell is selected, i.e. is addressed by the decoding circuitry in response to chip select and address inputs of a memory chip incorporating the memory cell. If the memory cell is unselected during a read or write operation, a logical "0" is applied to the selection conductor. A reference voltage circuit is provided on the semiconductor memory chip including an array of the four-IGFET memory cells in a preferred embodiment of the invention. The reference voltage circuit operates so that each row selection conductor, which is coupled to the gating IGFETS of a row of memory cells, is coupled to the reference voltage conductor when the semiconductor chip is unselected by a separate coupling IGFET coupled, respectively, between the reference voltage conductor and each of the selection conductors. Each selection conductor is also coupled to a selection circuit, which couples the selection conductor toward a $V_{DD}$ power supply voltage if the corresponding row has been selected by the decode circuitry and the chip is "selected". However, if the particular row is not selected, then the corresponding selection conductor is coupled by two IGFETS to a ground voltage supply conductor (if the chip is "selected").

4 Claims, 3 Drawing Figures

STATIC STORAGE TECHNIQUE FOR FOUR TRANSISTOR IGFET MEMORY CELL

BACKGROUND OF THE INVENTION

1. Field of the Invention

The invention relates to semiconductor memory circuits.

2. Description of the Prior Art

Four transistor IGFET memory cells have the utilized in the past as dynamic memory cells. However, such four transistor IGFET storage cells are relatively unsuitable as static or DC storage cells. The most common static (i.e., DC) MOS storage cell utilizes six IGFETS, see U.S. Pat. No. 3,594,736 by Hoffman. However, the six transistor static storage cells utilize a substantial amount of power per cell, and also require substantially more chip area per cell. This is partly because two extra load devices are required, and because these load devices must have long channel length in order to minimize the power dissipation.

SUMMARY OF THE INVENTION

It is an object of this invention to provide a memory circuit which includes circuitry for generating an intermediate voltage level to a four-transistor memory cell when the memory cell is in a standby state and when said memory circuit is unselected.

It is another object of the invention to provide a memory circuit in which a reference voltage generator providing a reference voltage slightly in excess of two IGFET threshold voltages is coupled to a selection conductor coupled to a memory cell when the memory cell is in a standby condition and which, during a read or write operation, provides a full logical "1" level to be applied to the selected selection conductor and a zero level to be applied to all unselected selection conductors.

Briefly described, the invention is a memory circuit including a plurality of four-transistor IGFET memory cells each including first and second cross-coupled switching IGFETs coupled to first and second gating IGFETs and also including selection circuit means coupled to the gate electrodes of the first and second gating IGFETs for generating an intermediate voltage maintaining the memory cells in a low power dissipation standby condition and for generating a second voltage level for deselecting some of said memory cells and for generating a third voltage level on said first and second gating IGFETs during an operation of reading data from one of said memory cells or writing data into one of said memory cells.

DESCRIPTION OF THE INVENTION

Figure 1:
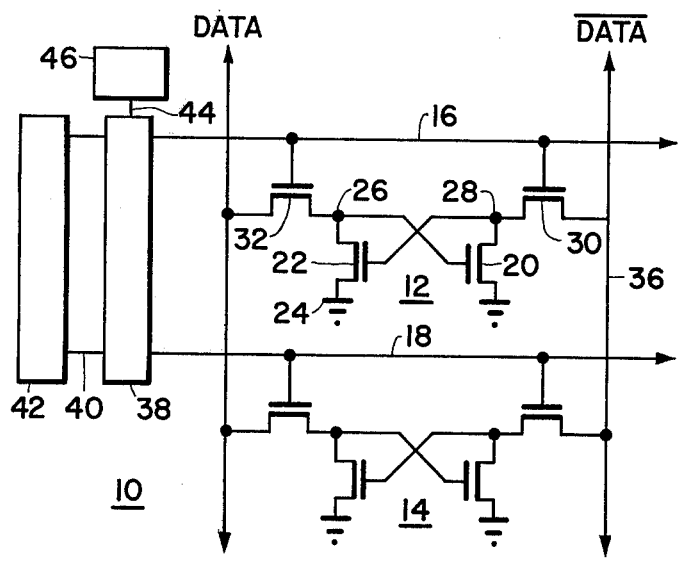
FIG. 1 is a partial schematic diagram of a memory circuit according to the invention.
Figure 2:
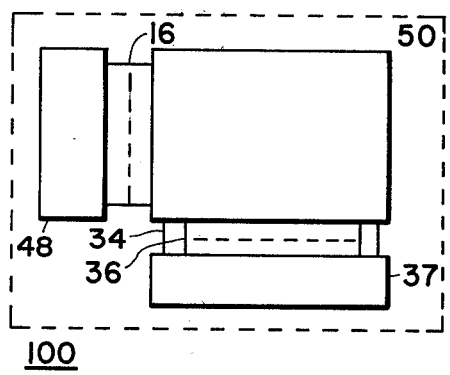
FIG. 2 is a block diagram of a semiconductor chip incorporating therein the memory circuit of FIG. 1.

Referring to FIG. 1, memory circuitry, 10 which may be included on a semiconductor chip 100 as shown in FIG. 2, includes two memory cells 12 and 14 each coupled between Data conductor 34 and $\overline{\text{Data}}$ conductor 36 and each coupled, respectively, to selection conductors 16 and 18. The schematic diagram of FIG. 1 illustrates a single column and two rows of memory cells. However, as the arrows on the X select conductors and on the Data and $\overline{\text{Data}}$ conductors indicate, the numbers of rows and columns may be increased to provide any rectangular array of storage cells.

Each of the memory cells includes four transistors, including two "switch" IGFETs having their gate and drain electrodes cross-coupled and two gating IGFETs. For example, memory cell 12 includes switching IGFETs 20 and 22 and gating IGFETs 30 and 32. IGFET 22 has its drain connected to first storage node 26 and its source electrode connected to ground conductor 24 and its gates connected to second storage node 28. Switching IGFET 20 has its drain connected to second storage node 28, its source connected to ground conductor 24 and its gate connected to first storage node 26.

First gating transistor 32 has one of its main electrodes connected to storage node 26, its other main electrode connected to data conductor 34 and its gate electrode connected to X selection conductor 16. Similarly, gating IGFET 30 has one main electrode connected to storage node 28, another main electrode connected to $\overline{\text{Data}}$ conductor 36 and its gate electrode connected to X selection conductor 16. In an expanded array, all memory cells in a given row have the gates of their gating IGFETs connected to a particular X selection conductor such as 16. Similarly, all memory cells in a given column are coupled between the common Data and $\overline{\text{Data}}$ conductors for that column.

It should be noted that the acronym IGFET (insulated gate field effect transistor) is commonly synonomously used with the acronym MOSFET (metal oxide semiconductor field effect transistor), and that IGFETs utilized in integrated circuits are generally bilateral devices having two main electrodes which operate interchangeably as sources and drains, depending on the relative voltages therebetween. IGFETs also have a gate electrode. As used herein and in the claims, the term source and drain are only used to indicate particular connections, and the term "main electrode" may also be utilized to designate a source or a drain, since during actual circuit operation a particular main electrode may operate either as a source or as a drain at different portions of the circuit operation. For a more comprehensive description of IGFETs see "Physics and Technology of Semiconductor Devices" by A. S. Grove, John Wiley & Sons, 1967.

Also shown in FIG. 1 is circuit section 38 which includes row selection circuitry, coupled to the X selection conductors 16 and 18 for providing the required intermediate voltage or logical "1" or logical "0" voltage, as explained above. Row selection circuitry 38 is coupled to intermediate voltage conductor 44, the intermediate voltage thereon being generated by reference voltage generator circuit 46. Row selection circuitry 38 is also connected by means of a plurality of conductors 40 to row decode circuit 42, which determines which row is selected in response to the configuration of a plurality of address inputs (now shown) if the semiconductor chip on which circuitry 10 is located is selected by a so-called Chip Select (CS) input.

Referring to FIG. 2, the block diagram of semiconductor chip 100 more clearly illustrates the relationship between the various major sections of the semiconductor memory chip. Rectangular storage array 50 includes a plurality of rows and columns of the above described four-IGFET memory cells such as 12 and 14. The decode and selection circuitry 48 incorporates the decode circuitry 42, row selection circuitry 38, and reference voltage generator circuit 46 of FIG. 1.

Figure 3:
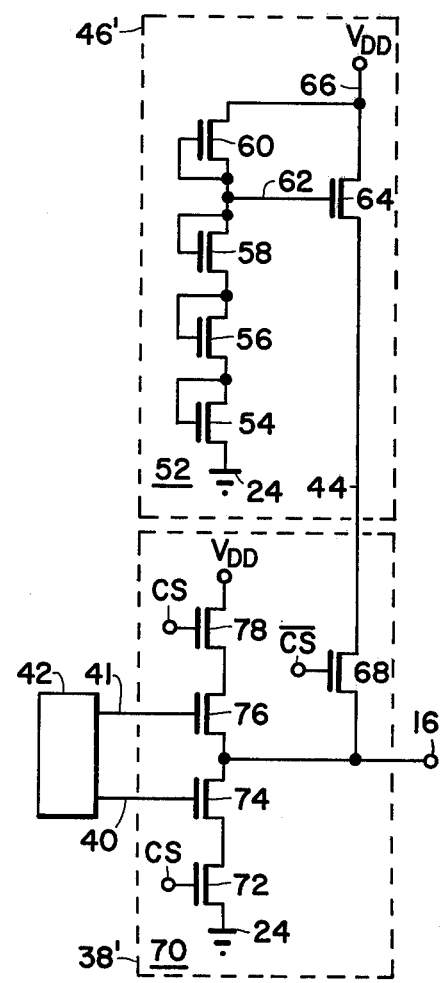
FIG. 3 is a schematic circuit diagram of circuitry included in the blocks of the embodiment of FIGS. 1 and 2.

FIG. 3 depicts exemplary circuitry for generating the above-mentioned intermediate reference voltage and selection circuitry for coupling the intermediate reference voltage to all of the X selection conductors such as 16 and 18 when semiconductor chip 100 as unselected and for properly selecting the addressed row selection conductor and deselecting the un-addressed row selection conductors when chip 100 is selected, and decoupling all of the row selection conductors from the reference voltage conductor 44 when chip 100 is not selected.

In one embodiment, intermediate reference voltage generator circuitry 46 of FIG. 1 includes circuit 46' of FIG. 3, which includes a reference circuit 52 coupled to an output IGFET 64 which has its gate connected to node 62, it drain connected to $V_{DD}$ conductor 66 and its source connected to intermediate reference voltage conductor 44. Reference circuit 52 includes a plurality of diode-connected IGFETs 54, 56, and 58 coupled in series between node 62 and ground conductor 24. Depending on the magnitude of the desired intermediate reference voltage, more or fewer diode-connected IGFETs may be coupled in series between node 62 and ground conductor 24. Load IGFET 60 is coupled between $V_{DD}$ and node 62.

Intermediate reference voltage conductor 44 is coupled to X selection conductor 16 by means of IGFET 68, which has its gate connected to $\overline{CS}$, which has a logical "1" thereon when semiconductor chip 100 is unselected, thereby turning IGFET 69 on when chip 100 is unselected. The source of IGFET 68 is connected to X selection conductor 16 and its drain is connected to intermediate reference voltage conductor 44. There are a plurality of other IGFETs not shown, which are similar to IGFET 68, except that they have their source electrodes coupled, respectively, to other of the X selection conductors such as 16, 18, etc., so that when chip 100 is unselected, the intermediate voltage on conductor 44 is applied to all X selection conductors, thereby maintaining an intermediate standby bias voltage to all memory cells in the entire array 50 at a relatively low power dissipation level which is nevertheless sufficient to prevent loss of stored data.

Each X selection conductor is also coupled to row selection circuitry which in FIG. 3 includes two MOSFETs 76 and 78 coupled in series between X selection conductor 16 and $V_{DD}$ conductor 66. IGFET 76 has its gate electrode connected to decode circuit 42 by means of conductor 41 which has a logical "1" voltage thereon if selection conductor 16 is the selected address selection conductor. In this case, conductor 40 will be at a logical "0" level. Then, when the chip is selected, a logical "1" will be on conductor CS, which turns IGFET 78 on, providing a low impedance path between the selected conductor 16 and $V_{DD}$, thereby turning on all of the gating IGFETs of all of the memory cells of the selected row. However, if selection conductor 16 is one of the unselected conductors, then the series combination of IGFET 72 and 74 coupled between selection conductor 16 and ground conductor 24 will be in the on condition, since conductor 40 has a logical "1" applied thereto for all unaddressed rows. In this case, conductor 41 has a logical "0" applied thereto so IGFET 76 is off for all of the unselected rows.

The operation during a standby condition in which chip 100 is unselected is described as follows. For each of the selected rows, the $\overline{CS}$ input is at a logical "1", and each of the coupling IGFETs such as IGFET 68 is on, so that all X selection conductors such as 16 and 18 are at two MOS threshold voltage drops plus some additional amount of voltage drop. The additional amount depends on the design of circuit 52, which generates a voltage equal to the sum of three IGFET threshold voltage drops at node 62, plus an additional amount dependent on the geometry of load IGFETs 60 and also on the geometries of diode connected IGFETs 54, 56, and 58, so that the intermediate voltage on conductor 44 is two MOS threshold voltages plus a designable additional voltage drop.

Then, assuming that a logical "1" is stored in each of memory cells 12 and 14, which, for purposes of definition herein, means that IGFET 20 is on for each of memory cells 12 and 14. Then second storage node 28 will be at approximately ground voltage for each of memory cells 12 and 14. IGFETs 30 and 32 will also be on for each memory cell, and the voltage on node 26 of each will be equal to one threshold voltage plus a small over-drive voltage, which maintains IGFET 20 on the on condition with only the excess voltage over one IGFET threshold voltage as the over-drive voltage, thereby keeping second storage node 28 at approximately ground voltage and keeping IGFET 22 in an off condition. Thus, it is seen that the power dissipation will be very low, since both IGFETs 20 and 30 will be over driven only by the small designed excess voltage. An exemplary value of the excess voltage for a state of the art N-channel MOS manufacturing process would be approximately two or three tenths of a volt. As long as the chip is in the unselected condition, every memory cell in the entire array would thus be biased by the intermediate voltage, and maintain its stored data with no danger of loss of stored information due to leakage of charge from a storage node.

However, if the memory chip 100 is selected, then each of the coupling IGFETs 68 would be turned off, and each of the IGFETs 72 and 78 for each row would be turned on. The addressed row would have its IGFET 76 turned on by a logical "1" generated on conductor 41 by decode circuit 42 and a logical "0" on conductor 40, turning IGFET 74 off, so that for the addressed row, selection conductor 16 would be at a logical "1", turning on gating IGFETs 30 and 32. However, for all of the unselected, or unaddressed rows, decode circuit 42 provides a logical "0" on conductor 41 and a logical "1" on conductor 40, so that instead, the unselected row selection conductors are clamped to ground or a logical "0" voltage through IGFETs 74 and 72, thereby deselecting all of the unselected memory cells by turning off the gating IGFETs 30 and 32 thereof.

During a write cycle, the information on the Data and $\overline{Data}$ conductors for the selected row are coupled into the storage nodes 26 and 28. During a read operation, both the Data and $\overline{Data}$ conductors are at a logical "1", and a full logical "1" voltage is applied to whichever of the switch transistors 20 or 22 is initially on, causing a large sense current to flow in one of the data conductors, which sense current is then detected and amplified by sense amplifier circuitry in block 37 of FIG. 2.

What is claimed is:

1. A memory circuit comprising a four transistor IGFET memory cell including first and second cross-coupled switch IGFETs coupled to first and second gating IGFETs, respectively, and selection circuit means coupled to gate electrodes of said first and second gating IGFETs for generating an intermediate voltage maintaining said memory cell in a standby state, and generating a second voltage level de-selecting said memory cell and generating a third voltage level on said first and second gating IGFETs during an operation of reading data from said memory cell or writing data into said memory cell wherein said selection circuitry comprises intermediate reference voltage circuit means for generating a reference voltage slightly greater than the sum of a switch IGFET threshold voltage and a gating transistor threshold voltage, and further includes a selection circuit including decoder circuitry for selecting one of a plurality of selection conductors coupled to a plurality of gating IGFETs, and electrically isolating said selection conductors from said decoder circuitry when said semiconductor chip is not selected and coupling said selection conductor to an output of said intermediate reference voltage circuit means when said semiconductor chip is unselected.

2. The memory circuit as recited in claim 1 wherein said IGFETs are N-channel IGFETs.

3. The memory circuit as recited in claim 1 wherein said intermediate reference voltage circuit means includes a plurality of diode-connected IGFETs coupled in series between said voltage supply conductor and another voltage supply conductor, and further includes an output IGFET having its gate coupled to a reference voltage node between two of said diode-connected IGFETs and its drain connected to said other supply voltage conductor, and its source connected to an output node, said output node having an intermediate reference voltage slightly in excess of two IGFET threshold voltages.

4. The memory circuit as recited in claim 3 wherein said X selection circuit means includes a first IGFET coupled between said output node and said selection conductor and having a gate electrode coupled to a conductor which has a zero voltage applied thereto when said memory circuit is unselected, and further includes circuit means for generating a logical "1" voltage level on said X selection conductor when said memory circuit is selected and when the X selection conductor is selected by said decoder circuit, and generates a logical "0" at said X selection conductor when said memory circuit is selected and said selection conductor is unselected by said decoder circuit.

* * * * *